United States Patent [19]

Mink

[11] Patent Number: 4,742,314
[45] Date of Patent: May 3, 1988

[54] SOLID STATE MILLIMETER WAVE POWER COMBINER

[75] Inventor: James W. Mink, Raleigh, N.C.

[73] Assignee: The United States of America as represented by the Secretary of the Army, Washington, D.C.

[21] Appl. No.: 908,136

[22] Filed: Sep. 11, 1986

[51] Int. Cl.[4] .......................... H03B 7/12; H03B 7/14
[52] U.S. Cl. ...................................... 331/56; 331/96; 331/107 DP; 331/107 P; 333/230
[58] Field of Search ............. 331/55, 56, 96, 107 DP, 331/107 P, 172; 333/230

[56] References Cited

U.S. PATENT DOCUMENTS 4,496,913  1/1985  Wandinger et al. .................. 331/56

Primary Examiner—Gene Wan
Assistant Examiner—David Mis
Attorney, Agent, or Firm—Saul Elbaum; Thomas E. McDonald; Alan J. Kennedy

[57] ABSTRACT

A plurality of millimeter wave power sources are arranged in a planar matrix array located in a wave-beam resonator including two reflecting surfaces which are large in terms of the operating wavelength. One surface comprises a planar reflector located in relatively close proximity to the source array, while the other reflector is located in front of the array at a relatively larger distance and being partially transparent and curved, with the curvature being expressed by a pair of focal lengths which define a curvature in two perpendicular axial planes. Each source is comprised of an IMPATT or GUNN diode coupled to a short dipole or closed current loop structure, all lying in a plane parallel to the planar reflector and transverse to the longitudinal central axis of the resonator.

15 Claims, 3 Drawing Sheets

SOLID STATE MILLIMETER WAVE POWER COMBINER

This invention may be manufactured and used by or for the Government for governmental purposes without the payment of any royalties thereon or therefor.

BACKGROUND OF THE INVENTION

This invention relates to a source of power utilizing semiconductor devices operating in the millimeter wave and near millimeter wave region of the electromagnetic spectrum and more particularly to quasi-optical power combining arrangement of solid state signal generating sources.

Conventional waveguide power combiners are limited in power output efficiency and number of sources that may be combined in the millimeter wave region. This limitation is a consequence of the requirement that linear dimensions of conventional waveguide resonators be of the order of one wavelength to achieve acceptable mode separation and to avoid multi-mode operation. On the other hand, quasi-optical resonators have linear dimensions large compared to wavelength and offer a solution for overcoming the foregoing limitations.

SUMMARY

Accordingly, it is an object of the present invention to provide an improvement in millimeter wave signal sources.

It is another object of the invention to provide an improvement in solid state millimeter wave signal sources.

Yet another object of the invention is to utilize quasi-optic resonator techniques for combining power generated by solid state millimeter wave signal sources.

The objects of the present invention are fulfilled by utilizing an array of millimeter wave source elements placed in a transverse plane near one reflecting surface of a wavebeam resonator of rectangular symmetry. The resonator acts as the combining element of an array of current elements within the resonant structure and power is extracted from the array to the lowest order or "Gaussian" mode of the resonator. The resonator, itself, is comprised of two energy reflecting surfaces which are large in relation to the operating wavelength, with one surface being a perfect planar reflector located in relatively close proximity to the source array while the other reflector is located in front of the array at a relatively large distance and being partially transparent and curved so that energy will leak through the partially transparent reflector. The reflector curvature is expressed by a pair of focal lengths which define a curvature in two perpendicular axial planes relative to the central longitudinal axis of the resonator. The array of current elements is comprised of an equally spaced rectangular matrix of IMPATT or GUNN diodes attached to a short dipole or loop which lie in a transverse plane relative to the central longitudinal axis of the resonator.

BRIEF DESCRIPTION OF THE DRAWINGS

The objects of the present invention and the attendant advantages thereof will become more readily apparent by reference to the following drawings wherein like numerals refer to like parts, and wherein.

DETAILED DESCRIPTION OF THE PREFERRED EMBODIMENT

Figure 1:
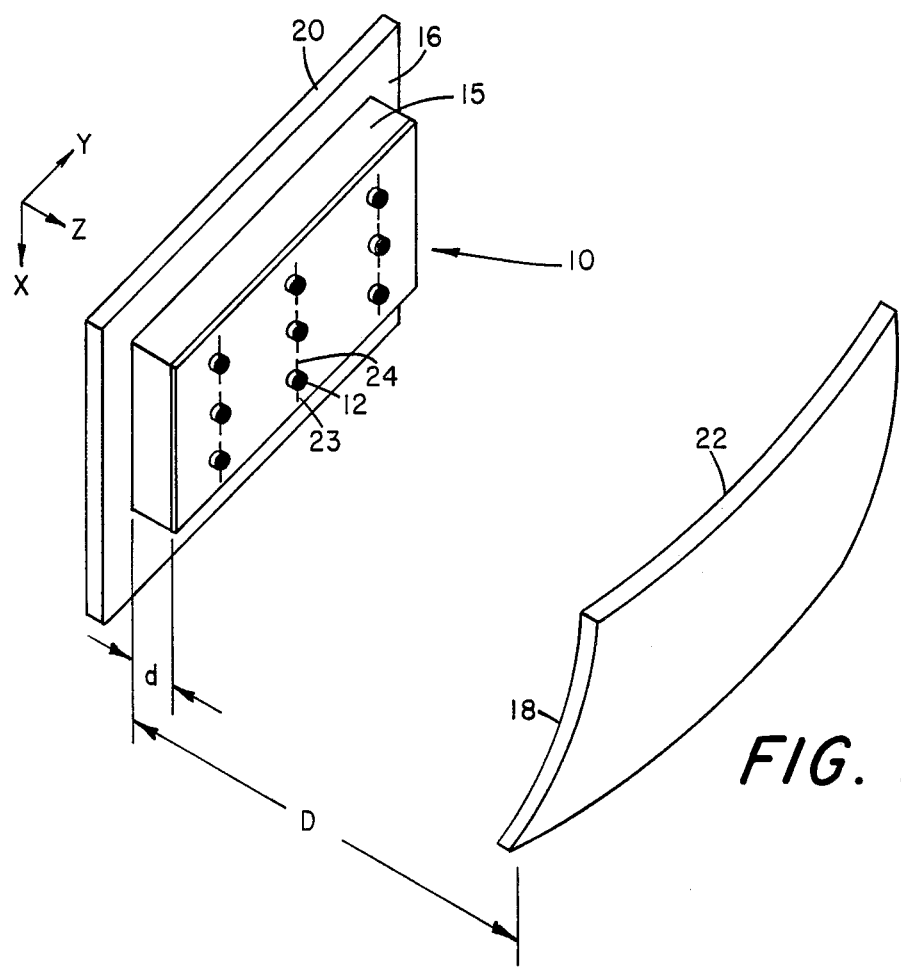
FIG. 1 is a perspective view of a resonator-source array configuration in accordance with the preferred embodiment of the invention.

Referring now to the drawings and more particularly to FIG. 1, reference numeral 10 denotes an array of millimeter wave sources 12 which are arranged in an equally spaced rectangular matrix on a flat or planar support member 14. The array 10 is located within a wave-beam resonator or Fabry-Perot resonator including two surfaces 16 and 18 which are large in comparison to the operating wavelength. One surface 16 is a perfect planar reflector of a rear member 20 and is located in relatively close proximity to the array 10. Both the planar array 10 and the planar reflecting surface 16 are parallel to the x-y axis of an orthogonal three axis reference system, where the z axis represents the longitudinal dimension of the resonator and is parallel to the longitudinal central axis of the resonator. With the rear planar surface 16 constituting the $z=0$ reference point, the array 10 is located a distance $z=d$ in front of the planar reflecting surface 16 while the other reflector surface 18 is located a distance $z=D$, where $D>>d$. The reflector surface 18 comprises the inner surface of a forwardly located curved member 22. Both member 22 and the reflecting surface 18 is partially transparent so that useful energy will leak therethrough with a well defined spatial distribution. The reflector surface 18, moreover, has a curvature which is expressed by a pair of focal lengths which define the curvature in two perpendicular axial planes, typically the x-z and the y-z planes.

Figure 2:
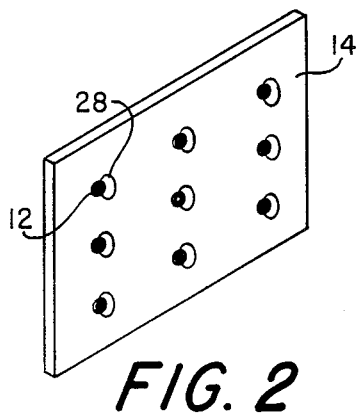
FIG. 2 is a perspective view of an alternate embodiment of a source array utilized in the resonator structure shown in FIG. 1.

The millimeter wave sources 12 are placed in a transverse x-y plane between the reflector surfaces 16 and 18 while being only slightly displaced from the planar reflector surface 16. Each source is implemented by either an IMPATT or GUNN diode, devices well known to those skilled in the art for generating millimeter wave and near millimeter wave signals. Each source 12, moreover, is coupled to a respective short dipole shown in FIG. 1 comprised of elements 24 and 26 which also lie in the x-y plane of the support member 14, and can, when desired, be fabricated using integrated circuit techniques. Instead of coupling dipole elements to the millimeter wave sources 12, one may simply fabricate respective small closed current loops in series with the sources 12 as shown in FIG. 2. Moreover, the space between the planar reflecting surface 16 and the source array 10 is typically filled with gallium arsenide (GaAs). Where IMPATT devices are utilized, the distance d typically is in the order of 0.1 mm.

When the source devices 12 are suitably energized, feedback coupling or signal interaction occurs between the resonant mode and the individual sources leading to injection locking and single frequency operation. The coupling coefficient of the source array for each mode can be calculated through the application of the Lorentz reciprocity theorem to be referred to subsequently. Also the driving point resistance of each dipole in the presence of all other excited dipoles, can be calculated.

For the configuration shown in FIG. 1, one must consider the E and H electromagnetic fields within the two regions of space on either side of the source array 10. Between the two reflecting sources 16 and 18, a resonant field exists which consists of two traveling waves, one propagating in the +z or forward direction, and a second equal amplitude wave traveling in the −z or backward direction. The sum of the traveling waves may be expressed as a standing wave whose transverse distribution is described as a sum of the wave beam mode. In the region where z>D, which is beyond the curve reflector 22, only waves traveling in the z direction exist and contain the same spectra of modes as the fields within the resonator.

In order to fully understand the operation of the power combining capability of the structure shown in FIG. 1, the following explanation is offered. Quasi-optic resonators are based upon the existence of reiterative wave beams or beam modes. These modes furthermore satisfy orthogonality relations like the wave modes in conventional tubular waveguides. In directions transverse to the direction of propagation, characteristic dimensions of fields contained within such wave-beam resonators are much larger than those in conventional waveguides and range from about 20 to many thousand wavelengths depending on the frequency and structures used. In the millimeter/sub-millimeter range, the transverse dimensions are typically from 20 to 100 wavelengths.

Modes of rectangular symmetry are utilized in this analysis since the beam modes as well as source coordinates of a regular rectangular array may be expressed in Cartesian coordinates. Wave-beams in Cartesian coordinates furthermore are satisfied by Hermite-Gaussian functions. Since the definition of the Hermite polynomials is not uniform in the various source literature where they are defined, the following definition for such a polynomial is used:

$$H_{en}(X) = (-1)^n (X^2/2) \frac{d^n}{dX^n} (\exp(-X^2/2)). \tag{1}$$

The following recurrence relation is also useful:

$$H_{e(n+1)}(X) = X H_{e(n)}(X) - n H_{e(n-1)}(X). \tag{2}$$

Hermite polynomials form a complete system of orthogonal functions within the range $-\infty \leq X \leq \infty$ with the weight function $\exp(-X^2/2)$. An ortho normal spectrum of wave beam modes may be obtained from this definition and is shown below for each linearly polarized component of the wave-beam:

$$E^{\pm}_{min}(x,y,z) = \frac{(\mu/\epsilon)^{\frac{1}{4}}}{\sqrt{\pi XY m! n!}} (1 + u^2)^{-\frac{1}{4}} (1 + v^2)^{-\frac{1}{4}} \cdot \tag{3}$$

$$H_{em}(\sqrt{2}\, x/x_z)\, H_{en}(\sqrt{2}\, y/y_z) \cdot$$

$$\exp\{-\tfrac{1}{2}[(x/x_z)^2 + (y/y_z)^2] - (m + \tfrac{1}{2})\tan^{-1}(u) -$$

$$(n + \tfrac{1}{2})\tan^{-1}(v)]\}\mp$$

-continued
$$j[kz + \tfrac{1}{2}(u(x/x_z)^2 + v(y/y_z)^2]$$

where $$u = z/kX^2,\ v = z/kY^2$$

$$x_z = X^2\left(1 + \frac{z^2}{k^2 X^4}\right),\ y_z = Y^2\left(1 + \frac{z^2}{k^2 Y^4}\right)$$

and the relationship between field components is $$E^{\pm}_{xmn} = \pm\sqrt{\frac{\mu}{\epsilon}}\, H^{\pm}_{ymn},\ E_Y^{\pm} = \mp\sqrt{\frac{\mu}{\epsilon}}\, H^{\pm}_{xmn}. \tag{4}$$

The argument (x, y, z) of the beam modes will be suppressed for simplicity. The E fields represent the desired wave-beam modes and the + sign refers to traveling waves progressing in the positive z direction while the − sign refers to waves traveling in the negative z direction. The subscripts x or y refer to the polarization. Quantities $\overline{X}$ and $\overline{Y}$ which determine the decay of the field in the x and y direction are called mode parameters. Mode parameters are parameters which are adjusted so that the wave-beam satisfies an imposed condition. When one considers a resonator structure, the condition that must be satisfied is that for each round trip of a wave within the resonator, the field repeats itself in both phase and amplitude distribution. It has been shown that the mode parameter is a function of resonator configuration and wavelength. For the resonator described above, the mode parameters become:

$$kX^2 = \sqrt{(2 - D/F_x) F_x D} \tag{5}$$

$$kY^2 = \sqrt{(2 - D/F_y) F_y D} \tag{6}$$

where $k = 2\pi/\lambda$, D = distance between the reflecting surfaces 16 and 18, $F_x$ = focal length of the curved reflector surface 18 referenced to the x axis and $F_y$ = the focal length of the curved reflector surface 18 referenced to the y axis.

The modes satisfy in any plane z = constant, the orthogonality relations $$\sqrt{\frac{\epsilon}{\mu}}\ \iint_{-\infty}^{\infty} E_{mn} \cdot E^*_{m'n'}\, dx dy = \delta_{mm'}\, \delta_{nn'}. \tag{7}$$

Since the Hermite-Gaussian functions form a complete system of orthogonal functions, any beam whose transverse electric field is known, and a plane = constant can be expanded into a series of wave-beam modes, providing the beam satisfies a paraxial propagation condition. Experience, however, has shown that this requirement is satisfied in practical systems and that the error tends to occur in higher order modes which usually are not of interest.

The mode described by equation (3) represent waves traveling through space. Referring now to FIG. 2, they describe the fields outside the resonator or in the region Z>D. In order to satisfy the boundary conditions within the resonator region, $0 \leq z \leq D$, one must take for each mode a sum of forward and backward traveling waves. Under resonant conditions, the fields within the resonaor may build up due to multiple reflections and the amplitude will be limited by the reflection coefficient of the partially transparent reflector. With application of the Lorentz reciprocity theorem that will follow, it is required to determine the resonator fields when excited by a properly adjusted beam consisting of a single mode or spectrum of modes incident from $z = \infty$ upon the resonator. These fields become the test fields. In order to compute the worst case fractional power coefficient, it is assumed that all modes resonate simultaneously. Because the total phase shift of a wave traveling from one reflector 16, for example, to the other 18, depends upon the mode numbers m and n, all modes will not resonate simultaneously in an actual beam resonator. The condition of simultaneous resonance is necessary to determine the best location of source elements. This formulation results in the worst case fractional power coupling coefficient. The fractional power coupling coefficient is defined as power in the desired mode, usually the fundamental or Gaussian mode divided by the power in all modes excited by the given current distribution. The partially transparent reflector surface 18 must be characterized in order to determine the electromagnetic fields within the resonator. This reflector may be considered as a lossless two-port junction. The scattering matrix of such a junction has certain well-defined properties listed below as:

$$S_{11} = S_{22} = Re^{j\theta} \tag{8}$$

$$S_{12} = S_{21} = \sqrt{1 - R^2} \; e^{j(\theta + \pi/2)}. \tag{9}$$

Now it is postulated that for a wave-beam incident upon the resonator from $z = \infty$, the wave-beams within the resonator have both amplitude and phase differences from the incident wave-beam. Since a perfect reflector is located at $z=0$, there is no net power flow through any plane $z>0$. Using the condition of zero net power flow through any transverse plane along the properties of the lossless partially transparent reflector surface 18, the field within the resonator becomes $$E_{mn}^T = ARe(E_{mn}^+) \sin(kz) \tag{10}$$

where $$A = \frac{2R\sin(\psi) + \sqrt{1 - R^2\cos^2(\psi)}}{\sqrt{1-R^2}} \; e^{j(\psi + \pi/2)}. \tag{11}$$

As seen by equation (11), the field strength is at maximum when $\psi = \pi/2$. For this value of $\psi$, the fields within the resonator are real; thus, the system is considered to be resonant.

One can now determine the coupling coefficient of a current element or to an arbitrary array of current elements through application of the Lorentz reciprocity theorem, with the further requirement that all current sources are located within the resonator. This theorem is outlined at pages 200–202 of the text entitled, "Field Theory of Guided Waves", by R. E. Collin, McGraw-Hill, New York, 1960. There is no loss in generality by considering only modes where $E_{ymn} = H_{xmn} = 0$ and the impressed currents are x-directed as expressed by the following expression:

$$\oiint_S (E_{mn}^\pm \times H_1 - E_1 \times H_{mn}^\pm) \cdot nda = \iiint_{V_R} J \cdot E_{mn}^T dv \tag{12}$$

where $E_{mn}^\pm$ and $H_{mn}^\pm$ = modal fields in space, $E_{mn}^T$ and $H_{mn}^T$ = fields within the resonator expressed in terms of the modal fields, $E_1$ and $H_1$ = fields in space due to the current elements, and $V_R$ = volume bounded by the resonator.

Figure 3:
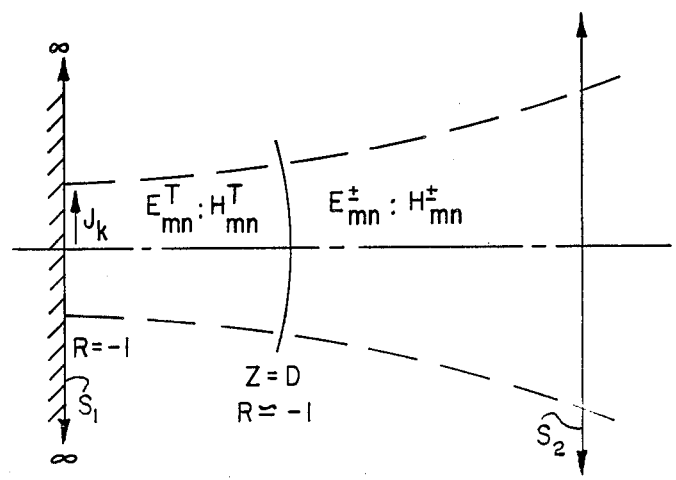
FIG. 3 is a cross sectional diagram helpful in understanding the operation of the present invention.

The method used to find the field radiated by an arbitrary array of filamentary currents within a quasioptical resonator is to expand the radiated field in terms of normal beam waveguide modes (Hermite-Gaussian functions) and determine the amplitude coefficients in this expansion. With reference now to FIG. 3, let $J_k$ represent an arbitrary infinitely thin current element. Such a current must be maintained by some external source, such as an IMPATT or GUNN diode 12 shown in FIGS. 1 and 2, but in the evaluation of the coupling to the beam modes, only radiated fields are of interest and consequently the source which maintains the specified current is not shown.

The field radiated in the positive z axis direction by the array of x-axis directed current elements may be represented by:

$$E_1 = \sum_{kq} a_{kq} E_{kq}^+ x \quad \text{for } z > D \tag{13}$$

$$H_1 = \sqrt{\frac{\epsilon}{\mu}} \sum_{kq} a_{kq} E_{kq}^+ y \quad \text{for } z > D. \tag{14}$$

Since there is a perfectly conducting planar surface located at $z = 0$ as shown in FIG. 3 which corresponds to the surface 16 of FIG. 1, $$E_{mn}^T(x, y, \phi) = 0. \tag{15}$$

The volume chosen over which it is required to evaluate the Lorentz reciprocity relation is bounded by a surface S which extends to infinity in the transverse directions and consists of an infinite, perfectly conducting plane $S_1$ located at $z=0$ and a second infinite plane $S_2$ located at z D. When one then performs the surface integration over this closed surface, there is only a contribution by the integrals evaluated on $S_2$. There is no contribution to the integral over $S_1$ since the $n \times E = 0$ along that surface.

$$\oiint_{S_2} \left[ E_{mn}^\pm x \times \sqrt{\frac{\epsilon}{\mu}} \sum_{kq} a_{kq} E_{kq}^+ y - \sum_{kq} a_{kq} E_{kq}^+ x \times \sqrt{\frac{\epsilon}{\mu}} E_{mn}^\pm y \right] \cdot nda = \iiint_{V_R} J \cdot E_{mn}^T dv. \tag{16}$$

Since $E_{mn}^- = E_{mn}^+$, one can utilize the orthogonality relation of equation (7) for wave beams and perform the integration term by term. Therefore, $$\oiint_{S_2} (E_{mn}^\pm \times H_1 - E_1 \times H_{mn}^\pm) \cdot nda = 2a_{mn}. \tag{17}$$

Hence $$a_{mn} = \frac{1}{2} \iiint_{V_R} J \cdot E_{mn}^T \, dv. \qquad (18)$$

Again, if one considers the case where the array consists of an array of filamentary currents, then the currents are all aligned with the electric field $E_{mn}^T$, and that the length of each current element is small compared to the mode parameter, equation (18) can be rewritten as follows:

$$a_{mn} \simeq \frac{1}{2} \sum_p I_p \Delta X_p E_{mn}^T(x_p, x_p, z_p) \qquad (19)$$

where $I_p$=the current into the "terminals" of the pth current element, $E_{mn}^T (x_p, y_p, z_p)$=the electric field strength of the m, n mode at the location of the pth current element, and $\Delta X_p$=the effective length of the pth current element.

Hence, $$\Delta X_p = \frac{1}{I_p} \int I_p(l) \cdot dl_p. \qquad (20)$$

Now with the knowledge of the expansion coefficients $a_{mn}$ given by (19) and (10), which relates fields internal to the resonator to the external fields, one can determine the total electric and magnetic fields $E_1$, and $H_1$, due to an array of current elements.

Since it is desirable to obtain a technique for efficient power transfer from an array of sources, one must know the driving point resistance at each element and then to match the source to the resistance. It is assumed that the resonator is adjusted for resonance; accordingly, the reactive component is zero or at least very small and since the dipole elements will be surrounded by a strong electric field due to resonance, the self impedance of the dipole can be neglected. The input impedance of a dipole element in the presence of an electric field $E^T$, created by all sources, may be expressed as:

$$Z_p^T = \frac{1}{I_p^2} \iiint_{V_R} J_p \cdot E^T dv \qquad (21)$$

where $Z_p^T$ is the driving point impedance for the pth current element.

A more useful result is the driving point impedance for a given mode. It has been shown theoretically and verified experimentally that a wave-beam resonator may be adjusted so that only one mode may exist for a given frequency, for example, the mode patterns of lasers. Once can, therefore, express the driving point resistance for each mode as follows:

$$Z_{pmn} = \frac{1}{I_p^2} \iiint_{V_R} J_p \cdot E_{mn}^T dv. \qquad (22)$$

Again, considering the case of small dipoles of equal equivalent length, the following expression is obtained:

$$Z_{pmn} = 2A(\Delta X)^2 \sin^2(k z_p) \cdot Re[E_{mn}^+ (x_p, y_p)] \sum_q \frac{I_q}{I_p} Re[E_{mn}^+(x_q, y_q)]. \qquad (23)$$

This result may also be obtained through considerations of energy conservation since the power flowing into a dipole element may be represented as the square of its terminal current multiplied by its driving point resistance. Now, total power into the system is the sum of the power flowing into all individual elements. When this total power is equated to the power flux of the forward traveling wave beam, one obtains the same result as shown by equation (23).

The mathematics developed above thus enables one to determine the number of current elements required to obtain efficient transfer of power to any wave-beam mode. Of primary interest is the current source locations within the resonator, their amplitudes and the driving-point resistance for each element when the lowest order, i.e. Gaussian wavebeam, is efficiently excited. A specific case will now be considered, i.e., the case where all current elements are assumed to have equal current moment.

To obtain efficient coupling, the current elements must be distributed in a transverse plane in such a way that power is efficiently transferred to the lowest order mode and very little power is transferred to any other modes. The efficiency of coupling may be calculated for a given distribution of currents by computing the power radiated by the lowest order mode and comparing it to the total power radiated. From equation (13), it can be seen that the amplitude of each mode is represented by the coefficient $a_{qk}$. Thus, using equation (4), the power of each mode may be calculated as follows:

$$P_{qk} = a_{qk}a_{qk}^* \sqrt{\frac{\epsilon}{\mu}} \iint_{-\infty}^{\infty} E_{qk} \cdot E_{qk}^* dx dy \qquad (24)$$
$$= a_{qk}a_{qk}^*.$$

Since the modes are orthogonal for a given array of current elements, the fractional power of the fundamental mode m=0, n=0 compared to the total power of all modes becomes:

$$FP_{00} = \frac{a_{00}a_{00}^*}{\sum_{qk} a_{qk}a_{qk}^*}. \qquad (25)$$

It should be noted that the excitation coefficient for any mode is determined only by the current distribution and the modal spectrum as if it were freely propagating in space. This restriction is required to obtain the optimum current distribution for the excitation of any given mode. If it were not applied, the mode spectrum would not be complete from the mathematical point of view. From an actual engineering point of view, it represents the worst case since it assumes that all modes are at resonance. Thus each mode could extract energy from the current elements and is included in the denominator of equation (25). This assumption clearly aids in determining the optimum source array configuration.

Figure 4:
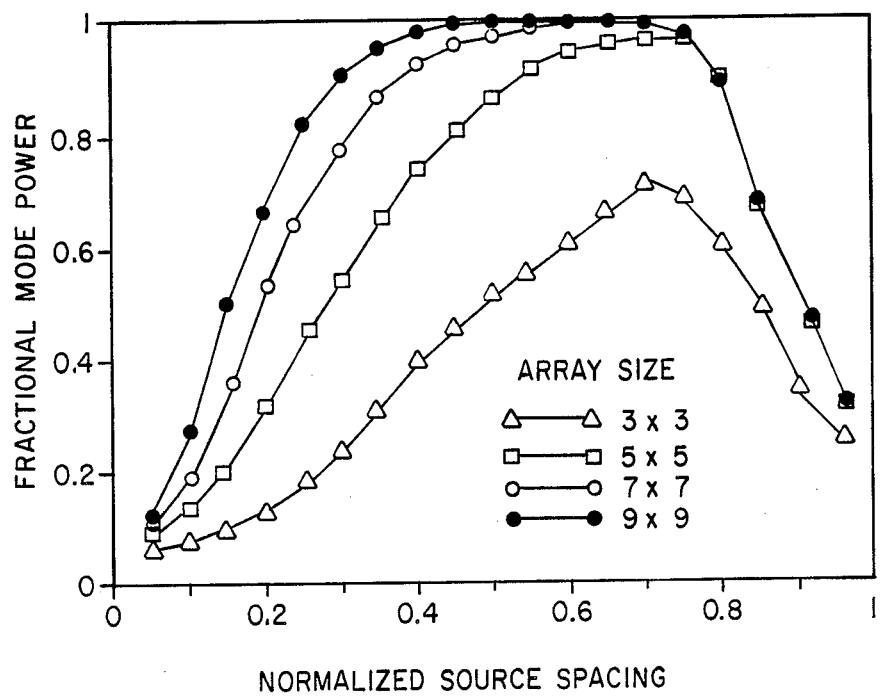
FIGS. 4, 5 and 6 are graphs illustrative of the operational characteristics of the embodiment shown in FIG. 1.

Referring now to FIG. 4, illustrated thereat is the fractional power coupled into the fundamental mode for four different matrix type array configurations containing 9, 25, 49 and 81 elements in regular rectangular arrays of equal moment sources with their individual phases adjusted so that each term of equation (19) is real. This figure as well as FIGS. 5 and 6 utilize normalized source spacings so that the results presented are independent of the details of the wave beam resonator. A total of 441 modes are utilized in the computation of the denominator in equation (25). It should be noted, however, that normalization must be removed when a particular application is to be considered.

To achieve meaningful normalization, the spacing between the source elements in each direction is expressed in terms of the wave-beam mode parameter, i.e. the $1/e^2$ distance. The source array is considered to lie in a plane transverse to the wave-beam and is symmetrical about the wave-beam axis which is in the z axis direction of FIG. 1. The desired location for the source array is very close to the reflecting surface located at $z=0$, also shown in FIG. 1. For this location, all elements 12 will have uniform phase and the rear reflecting surface element 20 can also become the heat sink for the active elements.

In terms of coupling energy into the fundamental mode, FIG. 4 shows that for each array configuration, there is an optimum source element spacing. It also indicates that the maximum source array length for the optimum coupling is substantially independent of the number of array elements. The array will extend in each direction from the wave beam axis about 1.2 mode parameters. Since the ultimate goal is to combine many individual sources to obtain a high power source, the total power delivered to the fundamental mode must be determined.

Figure 5:
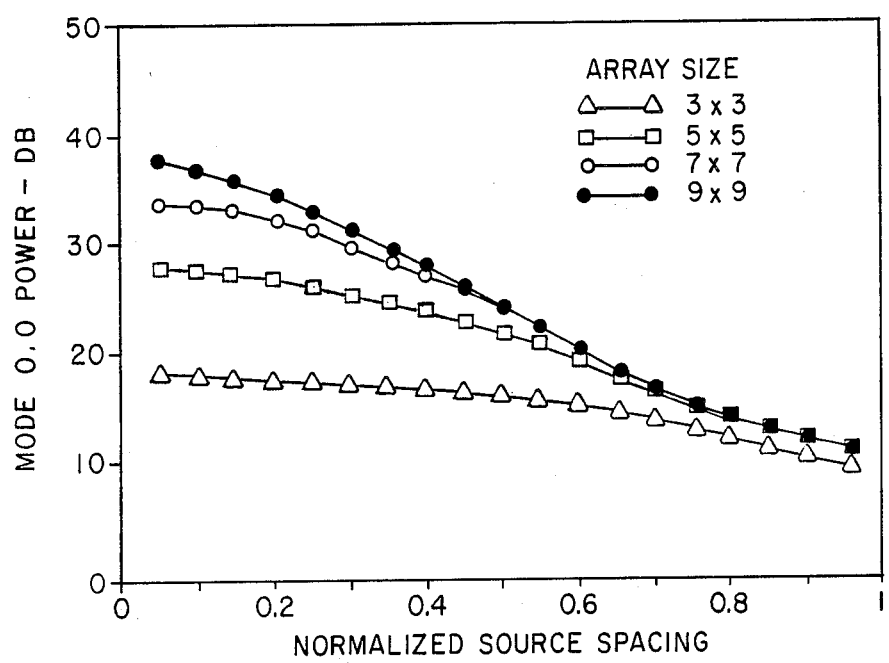

FIG. 5 is illustrative of the fact that the increase of power as the number of sources increases. Zero decibels (db) of FIG. 5 is a measure of power to the fundamental mode by a single source located on axis. The trend of these curves shows that one should make a trade off between element spacing for optimum fractional power and fundamental mode power. It appears that the source spacing should be reduced so that the optimum fractional power reduces by about 1 dB.

Utilizing equation (23), a family of curves for the driving-point resistance of each element of the source array can be obtained. However, the family of curves can be reduced to a single curve for each array configuration. Equation (23) may then be written as:

$$R_{pmn} = \frac{(\Delta X)^2}{XY} \sin^2(kz_p) \sqrt{\frac{1+R}{1-R}} \cdot [Re[\sqrt{XY} \, E^+_{mn}(x_p,y_p)]R \quad (26)$$

$$R = 2 \sum_q \frac{I_q}{I_p} Re[\sqrt{XY} \, E^+_{mn}(x_q,y_q)]. \quad (27)$$

Figure 6:
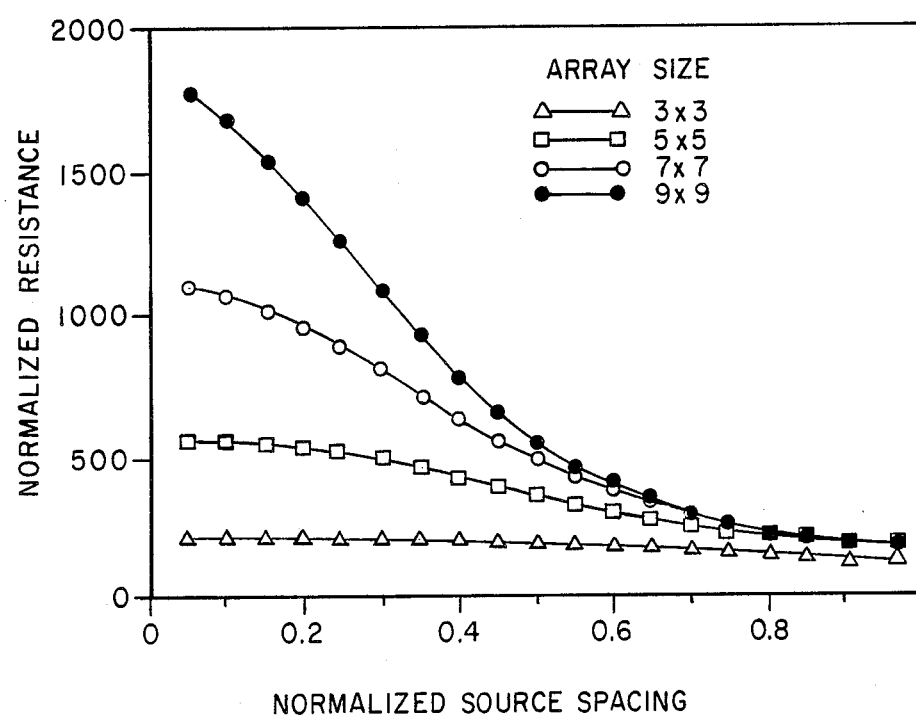

Now equation (27) represents a normalized resistance factor and depends only upon normalized source spacing, while equation (26) is the actual driving-point resistance and requires detailed knowledge of the resonator configuration. FIG. 6 is illustrative of the normalized driving-point resistances for the four array configurations considered above, where each element has the same effective length and driving-point current.

FIG. 4 then shows that efficient transfer of energy between the array and wave beam may be obtained for source arrays of a $5 \times 5$ and larger if the proper spacing between elements is chosen, while FIG. 5 shows that with the same spacing between array elements, there is a diminishing return of power transferred to the fundamental mode as the source arrays become larger.

Consider a typical example where the active elements 12 are arranged in a configuration of a uniform $5 \times 5$ array fabricated on a monolithic structure fabricated from a Group III-V compound such as gallium aresenide (GaAs). For such an arrangement the transverse dimension of the plane reflector 16 becomes substantially 5 cm, which is about the size of available GaAs wafers.

The resonator is semi-confocal, and therefore, $F_x = F_y = D$. With the mode parameters $\overline{X}$ and $\overline{Y}$ being on the order of 1 cm, the resulting operating frequency is in the range of 100 GHz. As a result the normalized current element length $\Delta X/X$ becomes 1/50, the normalized spacing between the source elements is 0.4, and the reflection coefficients are of the partially transparent reflector become 0.98. From equations (5) and (6), a dimension $D=20.9$ cm. results.

The driving point resistance for each element of such a source array is shown in the following Table I.

TABLE I

| Source Element No. | R - ohms | | |
|---|---|---|---|
| | d = 0.05 mm | d = 0.1 mm | d = 0.15 mm |
| 0,0 | 2.11 | 8.43 | 18.9 |
| 1,0 | 1.95 | 7.78 | 17.5 |
| 1,1 | 1.79 | 7.78 | 16.2 |
| 2,0 | 1.53 | 6.12 | 13.7 |
| 2,1 | 1.41 | 5.65 | 12.7 |
| 2,2 | 1.11 | 4.44 | 10.1 |

It should be noted that, because of symmetry, there are only six different driving point resistances shown. The array elements are all numbered in matrix notation with the element 0,0 being located on the wave beam axis. For the example shown in Table I, the driving-point resistances are computed by use of equation (26) for a source array located 0.05, 0.1 and 0.16 mm from and parallel to the plane reflector 16 shown in FIG. 1. In addition, the region of space between the source array 10 and the plane reflector element 20 is filled with gallium aresenide as shown by reference numeral 15. Since IMPATT devices are designed to operate with low driving-point resistances, when utilized, a distance $d=0.1$ mm can be conveniently chosen as a compromise between the desired low driving-point resistances and the minimum practical thickness of GaAs.

If each active source element is able to maintain the same driving current independent of other nearby sources, and if a single source provies an output power of 1 mw when combined with a quasi-optical power combiner as shown in FIG. 1, 25 sources in a $5 \times 5$ array would provide an output of approximately 300 mw. Forty nine such sources in a $7 \times 7$ array would provide about 630 mw, while 81 such sources in a $9 \times 9$ array would provide substantially 800 mw.

The above three examples assume that the separation between source elements remains constant at 0.4 mode parameters and indicates that there may be a diminishing return upon increasing the number of source elements to very large numbers.

Nevertheless, what has been shown and described is a power combiner of millimeter wave sources using quasi-optical techniques whereby substantial power output may be obtained.

Having thus shown and described what is at present considered to be the preferred embodiment of the invention it should be understood that the same has been made by way of illustration and not limitation. Accordingly, all modifications, alterations and changes coming within the spirit and scope of the invention are herein meant to be included.

What is claimed is:

1. Apparatus for combining power of electromagnetic energy sources in the millimeter wave range of the electromagnetic spectrum, comprising in combination:

a quasi-optical wave-beam resonator including a pair of mutually separated reflecting surfaces which are dimensionally large in comparison to the operating wavelength of the resonator, one of said reflecting surfaces further being planar and substantially totally reflective of millimeter wave energy, with the other of said reflecting surfaces being curved and partially transparent to millimeter wave energy so that energy can pass therethrough; and a plurality of millimeter wave energy sources arranged in an array in a common transverse plane between said reflecting surfaces and in relatively close proximity to said one reflecting surface.

2. The apparatus as defined by claim 1 wherein said plurality of energy sources are arranged in a matrix.

3. The apparatus as defined by claim 2 wherein said plurality of energy sources are arranged in a matrix comprising an equal number of energy sources in each mutually orthogonal direction.

4. The apparatus as defined by claim 3 wherein said energy sources are equally spaced.

5. The apparatus as defined by claim 2 wherein said plurality of energy sources are comprised of semiconductor devices.

6. The apparatus as defined by claim 5 wherein said energy sources include respective energy radiator means coupled to each of said semiconductor devices.

7. The apparatus as defined by claim 6 wherein said energy radiator means comprises a pair of dipole elements coupled to each said semiconductor device.

8. The apparatus as defined by claim 6 wherein said energy radiator means comprises a series connected loop element coupled to each said semiconductor device.

9. The apparatus as defined by claim 5 wherein said semiconductor devices are comprised of IMPATT diodes.

10. The apparatus as defined by claim 5 wherein said semiconductor devices are comprised of GUNN diodes.

11. The apparatus as defined by claim wherein said other reflecting surface has a curvature having a pair of focal lengths which define said curvature in two mutually perpendicular planes orthogonal to the central longitudinal axis of the resonator.

12. The apparatus as defined by claim 1 wherein said array of energy sources are fabricated on a monolithic substrate comprised of a Group III-V compound.

13. The apparatus as defined by claim 12 wherein said compound comprises gallium arsenide.

14. The apparatus as defined by claim 1 wherein said array of energy sources is located a distance d from said one reflecting surface and wherein said other reflecting surface is located a distance D from said one reflecting surface and wherein $D>>d$.

15. The apparatus as defined by claim 14 wherein d is substantially 0.1 mm and wherein D is substantially 20.9 cm.

* * * * *